(12) United States Patent
Wang et al.

(10) Patent No.: US 9,595,457 B2
(45) Date of Patent: Mar. 14, 2017

(54) METHODS AND APPARATUS FOR CLEANING SEMICONDUCTOR WAFERS

(75) Inventors: Jian Wang, Shanghai (CN); Sunny Voha Nuch, Shanghai (CN); Liangzhi Xie, Shanghai (CN); Junping Wu, Shanghai (CN); Zhaowei Jia, Shanghai (CN); Yunwen Huang, Shanghai (CN); Zhifeng Gao, Shanghai (CN); Hui Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 985 days.

(21) Appl. No.: 13/133,826

(22) PCT Filed: Dec. 12, 2008

(86) PCT No.: PCT/CN2008/073471
§ 371 (c)(1),
(2), (4) Date: Aug. 19, 2011

(87) PCT Pub. No.: WO2010/066081
PCT Pub. Date: Jun. 17, 2010

(65) Prior Publication Data
US 2011/0290277 A1    Dec. 1, 2011

(51) Int. Cl.
*H01L 21/67*     (2006.01)
*B08B 3/12*      (2006.01)

(52) U.S. Cl.
CPC .... *H01L 21/67051* (2013.01); *H01L 21/6708* (2013.01)

(58) Field of Classification Search
CPC ............ H01L 21/6708; H01L 21/67051; H01L 21/304; H01L 21/02041; H01L 21/0209; B05B 17/06; B08B 3/12
(Continued)

(56) References Cited

U.S. PATENT DOCUMENTS 4,326,553 A    4/1982  Hall
6,092,542 A *  7/2000  Matsuda et al. ............. 134/153
(Continued)

FOREIGN PATENT DOCUMENTS

JP      04213827 A  *  8/1992
KR   10-2007-0092887     12/2006

OTHER PUBLICATIONS

JPH04213827—Machine Translation.*

*Primary Examiner* — Michael Kornakov
*Assistant Examiner* — Marc Lorenzi
(74) *Attorney, Agent, or Firm* — Osha Liang LLP (57) ABSTRACT

A method for cleaning semiconductor substrate using ultra/mega sonic device comprising holding a semiconductor substrate by using a chuck, positioning a ultra/mega sonic device adjacent to the semiconductor substrate, injecting chemical liquid on the semiconductor substrate and gap between the semiconductor substrate and the ultra/mega sonic device, changing gap between the semiconductor substrate and the ultra/mega sonic device for each rotation of the chuck during the cleaning process. The gap can be increased or reduced by $0.5\lambda/N$ for each rotation of the chuck, where $\lambda$ is wavelength of ultra/mega sonic wave, N is an integer number between 2 and 1000. The gap is varied in the range of $0.5\lambda n$ during the cleaning process, where $\lambda$ is wavelength of ultra/mega sonic wave, and n is an integer number starting from 1.

12 Claims, 14 Drawing Sheets

(58) Field of Classification Search
USPC .................................................. 134/1.3, 184
See application file for complete search history.

(56) References Cited

U.S. PATENT DOCUMENTS

| | | |
|---|---|---|
| 6,431,184 B1 | 8/2002 | Taniyama |
| 6,875,696 B2 | 4/2005 | Sakurai et al. |
| 2001/0032657 A1* | 10/2001 | Itzkowitz ........................ 134/1.3 |
| 2002/0162570 A1 | 11/2002 | Cavazza |
| 2002/0185152 A1 | 12/2002 | Lauerhaas et al. |
| 2002/0185164 A1* | 12/2002 | Tetsuka ............. H01L 21/67051 134/148 |
| 2003/0116175 A1* | 6/2003 | Sasaki ............... H01L 21/67057 134/1.3 |
| 2003/0205238 A1 | 11/2003 | Bran |
| 2004/0132318 A1* | 7/2004 | Kim et al. .................... 438/906 |
| 2004/0154637 A1* | 8/2004 | Boyd .................... B06B 1/0253 134/1.3 |
| 2005/0178402 A1 | 8/2005 | Stowell et al. |
| 2006/0030157 A1* | 2/2006 | Ivanov .................. B82Y 30/00 438/692 |
| 2006/0130871 A1 | 6/2006 | Hwang et al. |
| 2007/0137672 A1 | 6/2007 | Sasaki et al. |
| 2009/0071503 A1* | 3/2009 | Branz et al. ...................... 134/1 |
| 2010/0147336 A1* | 6/2010 | Obweger .......... H01L 21/67051 134/34 |

* cited by examiner

METHODS AND APPARATUS FOR CLEANING SEMICONDUCTOR WAFERS

FIELD OF THE INVENTION

The present invention generally relates to method and apparatus for cleaning semiconductor wafer. More particularly, relates to changing a gap between an ultra/mega sonic device and a wafer for each rotation of the wafer during the cleaning process to achieve an uniform ultra/mega sonic power density distribution on the wafer, which removes particles efficiently without damaging the device structure on the wafer.

BACKGROUND

Semiconductor devices are manufactured or fabricated on semiconductor wafers using a number of different processing steps to create transistor and interconnection elements. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the interconnection elements the semiconductor wafer may undergo, for example, masking, etching, and deposition processes to form the desired electronic circuitry of the semiconductor devices. In particular, multiple masking and plasma etching step can be performed to form a pattern of recessed areas in a dielectric layer on a semiconductor wafer that serve as trenches and vias for the interconnections. In order to removal particles and contaminations in trench and via post etching or photo resist aching, a wet cleaning step is necessary. Especially, when device manufacture node migrating to 65 nm and beyond, the side wall loss in trench and via during is crucial for maintaining the critical dimension. In order to reduce or eliminating the side wall loss, it is important to use moderate, dilute chemicals, or sometime de-ionized water only. However, the dilute chemical or de-ionized water usually is not efficient to remove particle in the trench and via. Therefore the mechanical force such as ultra sonic or mega sonic is needed in order to remove those particles efficiently. Ultra sonic and mega sonic wave will apply mechanical force to wafer structure, the power intensity and power distribution is key parameters to control the mechanical force within the damage limit and at the same time efficiently to remove the particles.

Mega sonic energy coupled with nozzle to clean semiconductor wafer is disclosed in U.S. Pat. No. 4,326,553. The fluid is pressurized and mega sonic energy is applied to the fluid by a mega sonic transducer. The nozzle is shaped to provide a ribbon-like jet of cleaning fluid vibrating at mega sonic frequencies for the impingement on the surface.

A source of energy vibrates an elongated probe which transmits the acoustic energy into the fluid is disclosed in U.S. Pat. No. 6,039,059. In one arrangement, fluid is sprayed onto both sides of a wafer while a probe is positioned close to an upper side. In another arrangement, a short probe is positioned with its end surface close to the surface, and the probe is moved over the surface as wafer rotates.

A source of energy vibrates a rod which rotates around it axis parallel to wafer surface is disclosed in U.S. Pat. No. 6,843,257 B2. The rod surface is etched to curve groves, such as spiral groove.

To uniformly apply right amount of mega sonic power to entire wafer is critical for the cleaning process. If the mega sonic power is not uniformly applied on the wafer, the portion of wafer receiving less mega sonic power will not be cleaned well, and leaving particles and contamination on the portion of the wafer, and portion of wafer receiving extra mega sonic power may cause the damage of device structure on the wafer.

It is needed to have a better method for controlling the mega sonic power density distribution on the wafer to clean particles and contamination on surface of wafer or substrate with higher efficiency and lower structure damages.

SUMMARY

One method of the present invention is to put a mega sonic device adjacent to front side of a rotating wafer during the cleaning process, and to increase the gap between the mega sonic device and the wafer for each rotation of the wafer. The increment of the gap for each rotation of the wafer is a friction of half wavelength of mega sonic wave, and the total increment of the gap is in the range of $0.5\lambda N$, where $\lambda$ is the wavelength of mega sonic wave, and N is an integer number starting from 1.

Another method of the present invention is to put a mega sonic device adjacent to front side of a rotating wafer during the cleaning process, and to reduce the gap between the mega sonic device and the wafer for each rotation of the wafer. The reduction of the gap for each rotation of the wafer is a friction of half wavelength of mega sonic wave, and the total reduction of the gap is in the range of $0.5\lambda N$, where is the wavelength of mega sonic wave, and N is an integer number starting from 1.

Another method of the present invention is to put a mega sonic device adjacent to back side of a rotating wafer, and to increase the gap between the mega sonic device and the wafer for each rotation of the wafer during the cleaning process. The increment of the gap for each rotation of the wafer is a friction of half wavelength of mega sonic wave, and the total increment of the gap is in the range of $0.5\lambda N$, where $\lambda$ is the wavelength of mega sonic wave, and N is an integer number starting from 1.

Another method of the present invention is to put a mega sonic device adjacent to back side of a rotating wafer, and to reduce the gap between the mega sonic device and the wafer for each rotation of the wafer during the cleaning process. The reduction of the gap for each rotation of the wafer is a friction of half wavelength of mega sonic wave, and the total reduction of the gap is in the range of $0.5\lambda N$, where $\lambda$ is the wavelength of mega sonic wave, and N is an integer number starting from 1.

DETAILED DESCRIPTION

Figure 1:
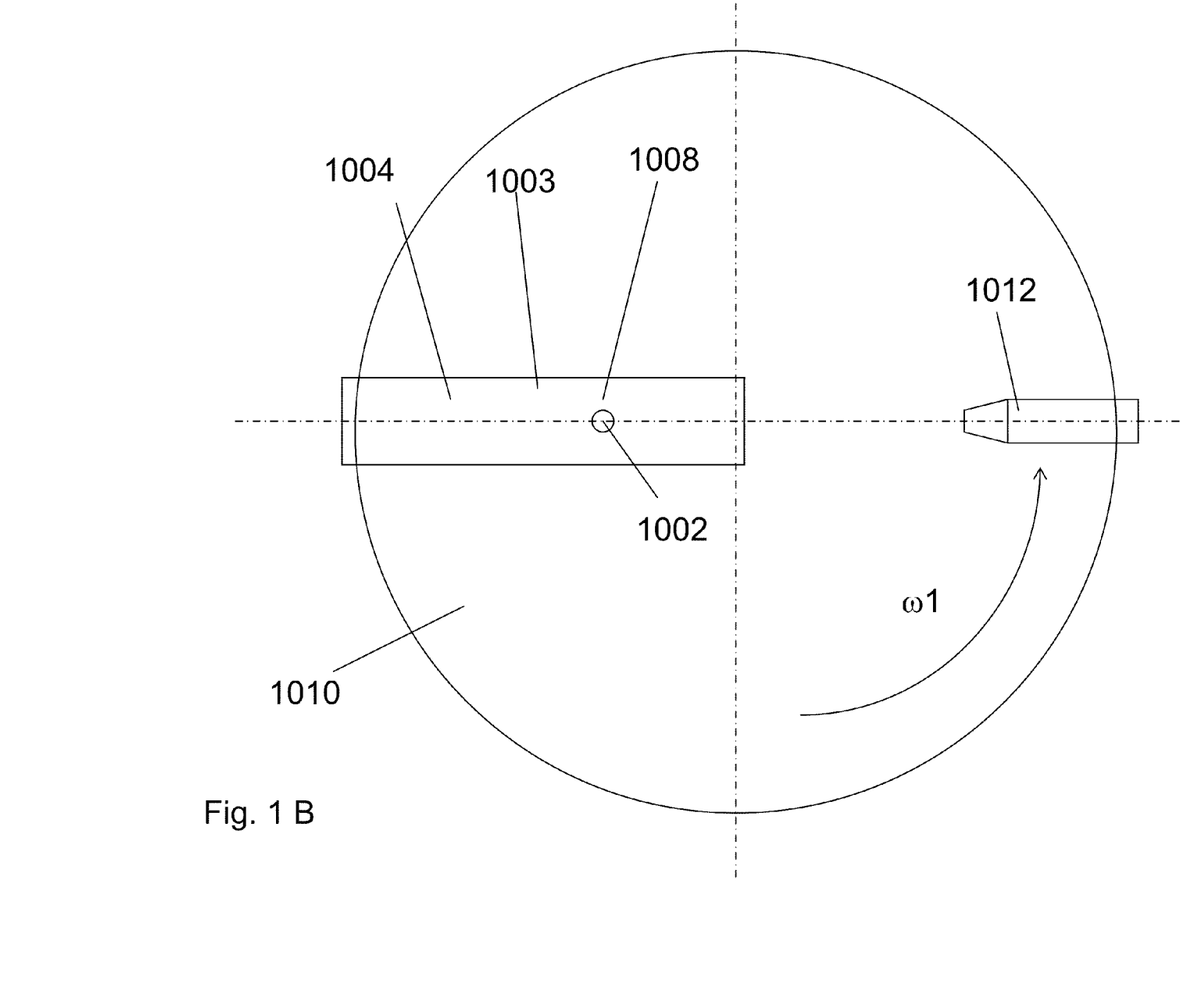
FIGS. 1A-1D depict an exemplary wafer cleaning apparatus.
Figure 1A:
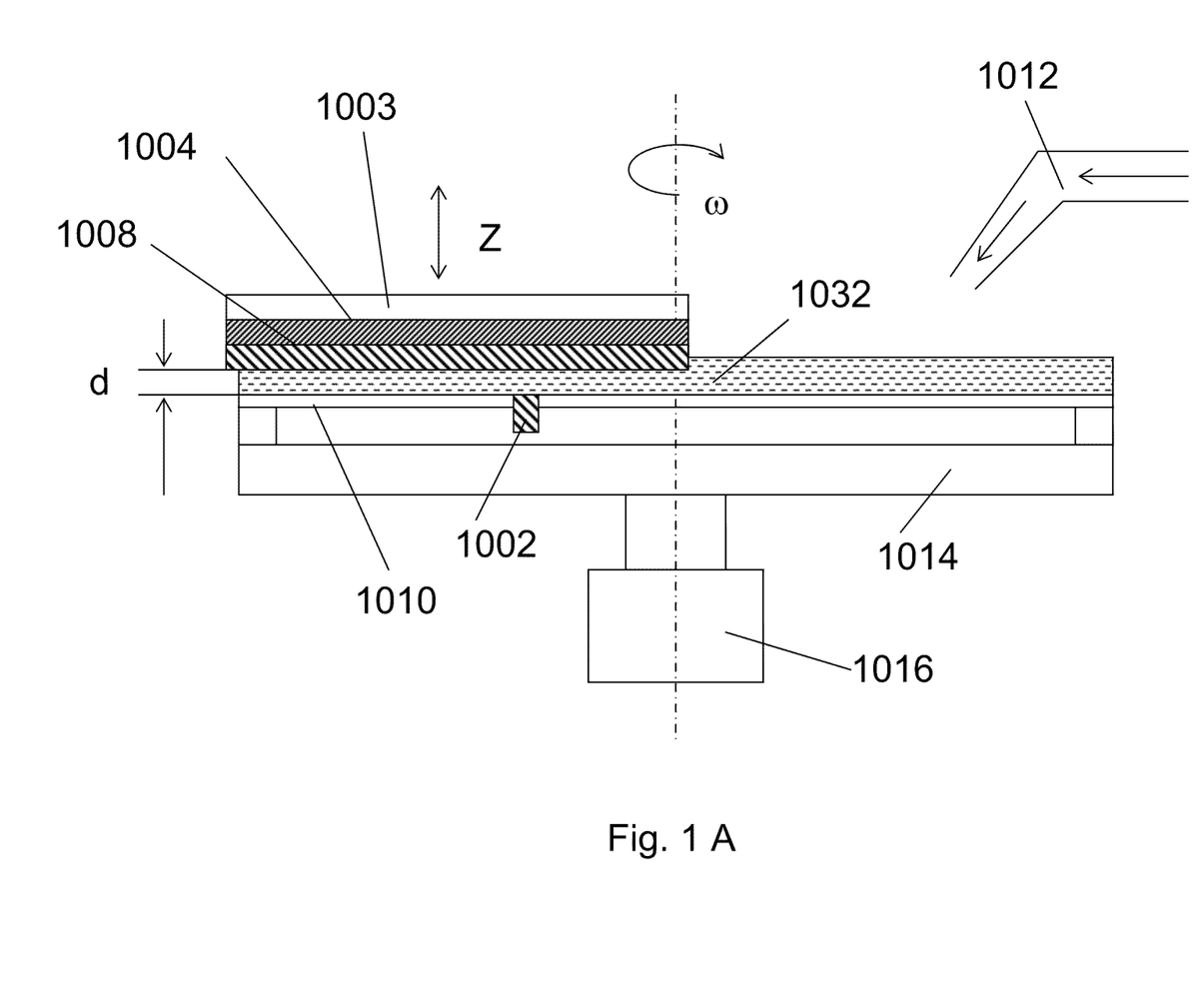

FIGS. 1A to 1B show the conventional wafer cleaning apparatus using a mega sonic device. The wafer cleaning apparatus consists of wafer 1010, wafer chuck 1014 being rotated by rotation driving mechanism 1016, nozzle 1012 delivering cleaning chemicals or de-ionized water 1032, and mega sonic device 1003. The mega sonic device 1003 further consists of piezoelectric transducer 1004 acoustically coupled to resonator 1008. Transducer 1004 is electrically excited such that it vibrates and the resonator 1008 transmits high frequency sound energy into liquid. The agitation of the cleaning liquid produced by the mega sonic energy loosens particles on wafer 1010. Contaminants are thus vibrated away from the surfaces of the wafer 1010, and removed from the surfaces through the flowing liquid 1032 supplied by nozzle 1012.

Figure 1C:
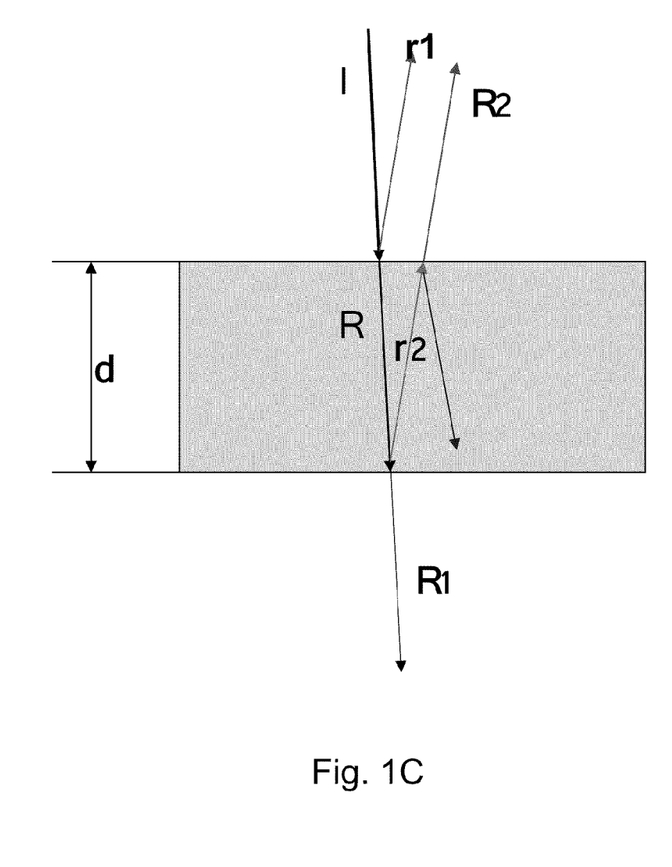

As shown in FIG. 1C, in order to achieve the least reflection energy, the phase reflection wave r1 (from top of water film) must be opposite to reflection R2 (bottom of water film), therefore water film thickness must equal to:

$$d = n\lambda/2, n=1, 2, 3, \quad (1)$$

Where, d is the thickness of water film or gap between mega-sonic device 1003 and wafer 1010, n is an integer number, and $\lambda$ is wavelength of mega sonic wave in water. For example, for mega sonic frequency of 937.5 KHz, $\lambda$=1.6 mm, the d=0.8 mm, 1.6 mm, 2.4 mm, and so on.

Figure 1D:
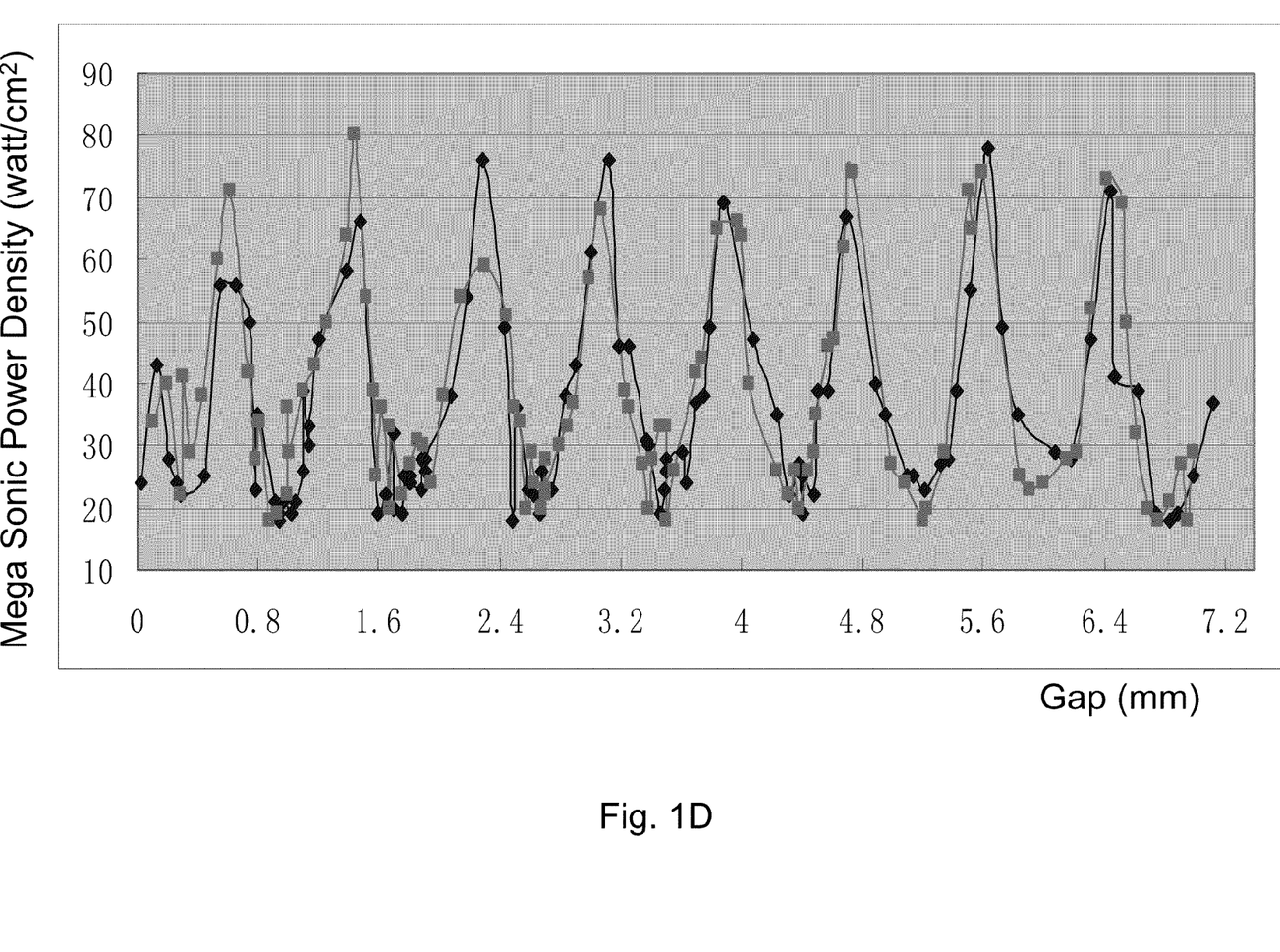

FIG. 1D shows the relationship between gap d and mega sonic power density measured by sensor 1002 as shown in FIG. 1A. Power density varies from valley value 20 w/cm2 to peak value 80 w/cm2 as gap size increase 0.4 mm, and reach a full cycle in the gap increment of 0.8 mm (0.5$\lambda$). It is critical to maintain a gap precisely in order to keep a uniform mega sonic power distribution on the entire wafer.

Figure 2:
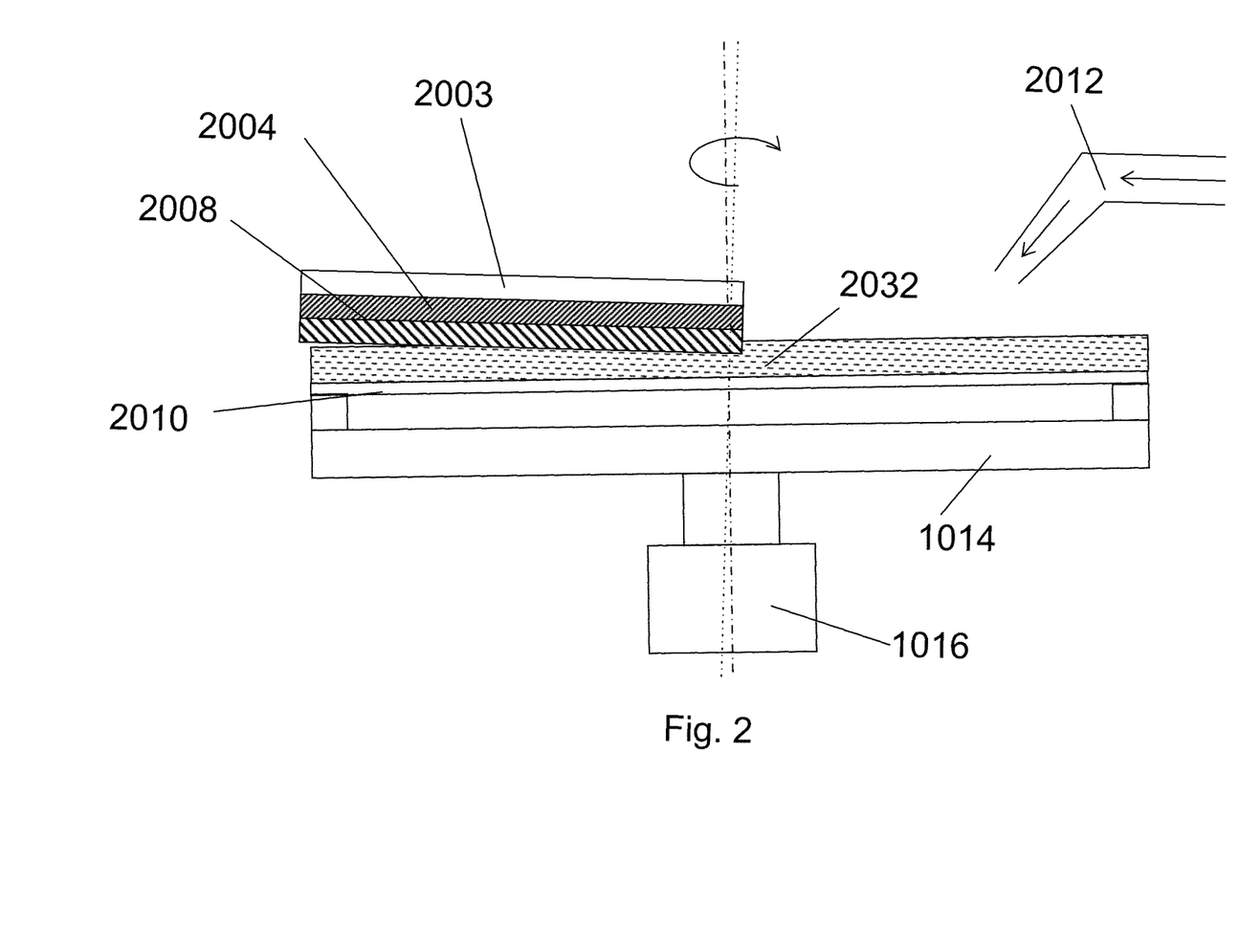
FIG. 2 depicts an exemplary wafer cleaning process.

However it is very difficult to keep a uniform gap in such precision in reality, especially when the wafer is rotation mode. As shown in FIG. 2, if wafer chuck 1014 is set not 100% vertical to surface of mega sonic device 2003, the gap between mega sonic device and surface of wafer 2010 is reducing from edge of the wafer to center of the wafer. It will cause non uniform mega sonic power density distribution from edge of the wafer to center of the wafer according to data shown in FIG. 1D.

Figure 3A:
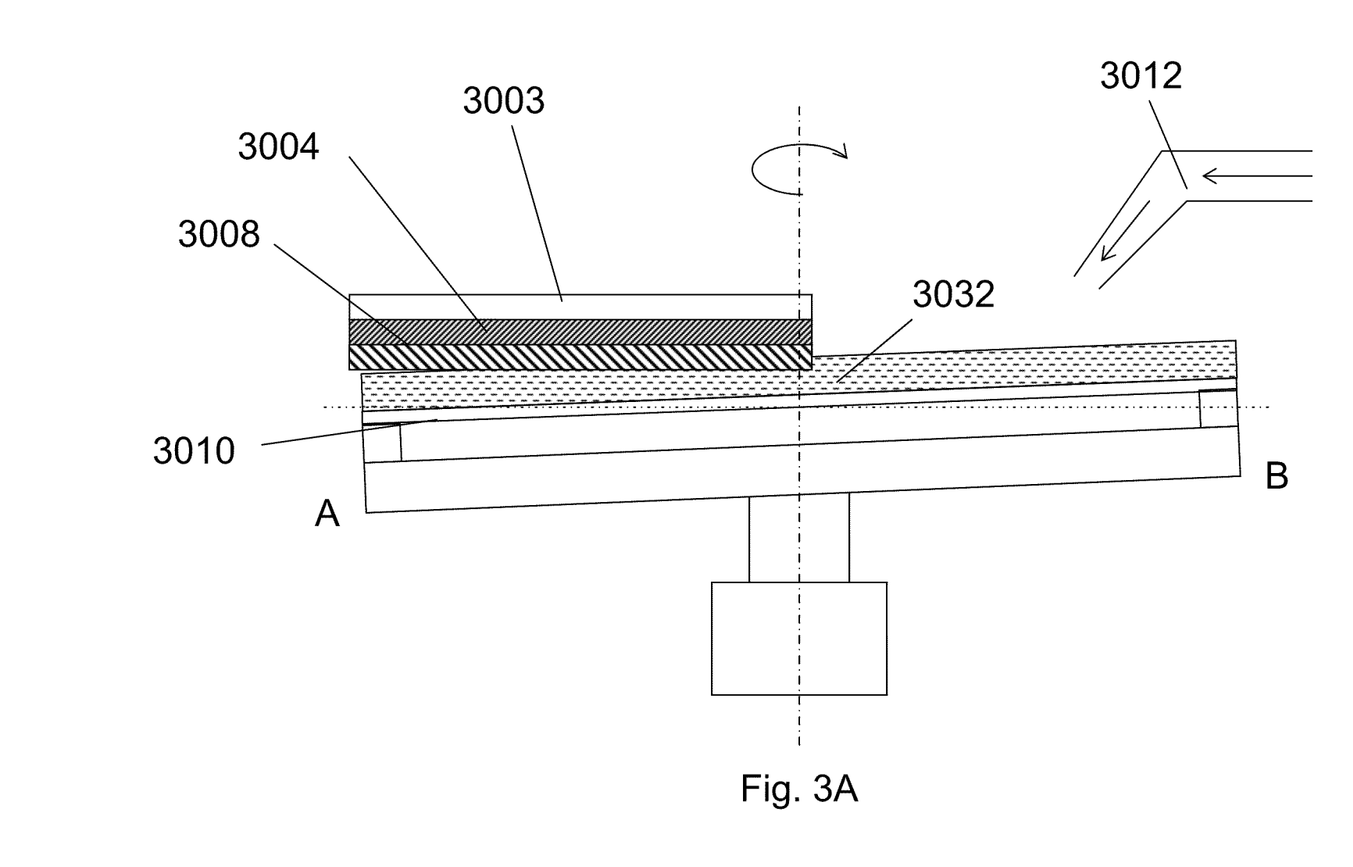
FIGS. 3A-3B depicts another exemplary wafer cleaning process.
Figure 3B:
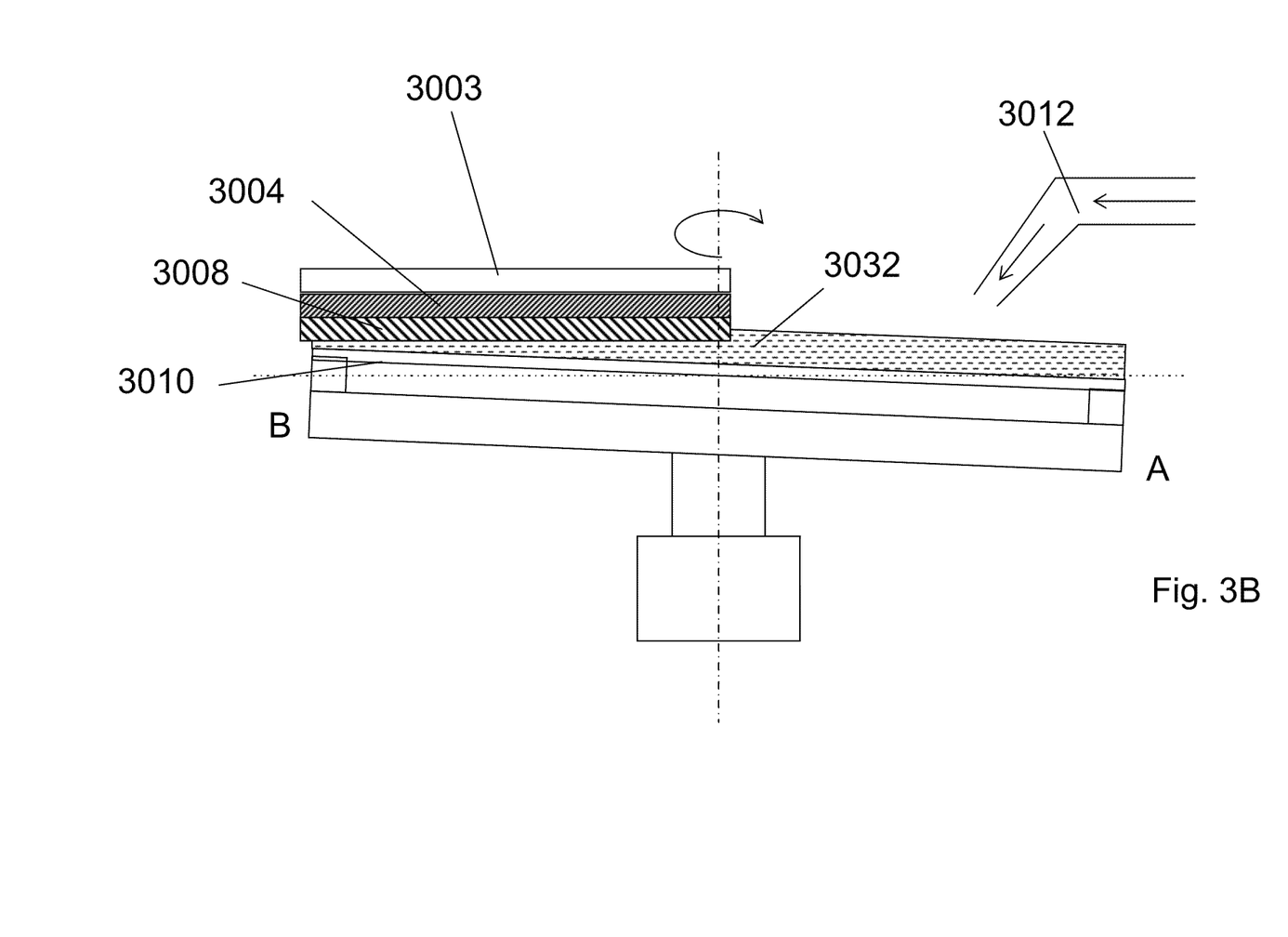

Another possible gap variation is caused by rotation axis of chuck being not vertical to surface of wafer 3010 as shown in FIGS. 3A and 3B. The wafer is wobbling when rotating, and FIG. 3B shows gap status after rotating 180 degree from status as shown in FIG. 3A. The gap at edge of wafer reduces from a biggest value as shown in FIG. 3A to smallest value as shown in FIG. 3B. It will cause non uniform mega sonic power density distribution on wafer as wafer passing mega sonic device. All such non uniform power distribution will either cause damage to device structure on the wafer and non uniform cleaning of the wafer.

Figure 4:
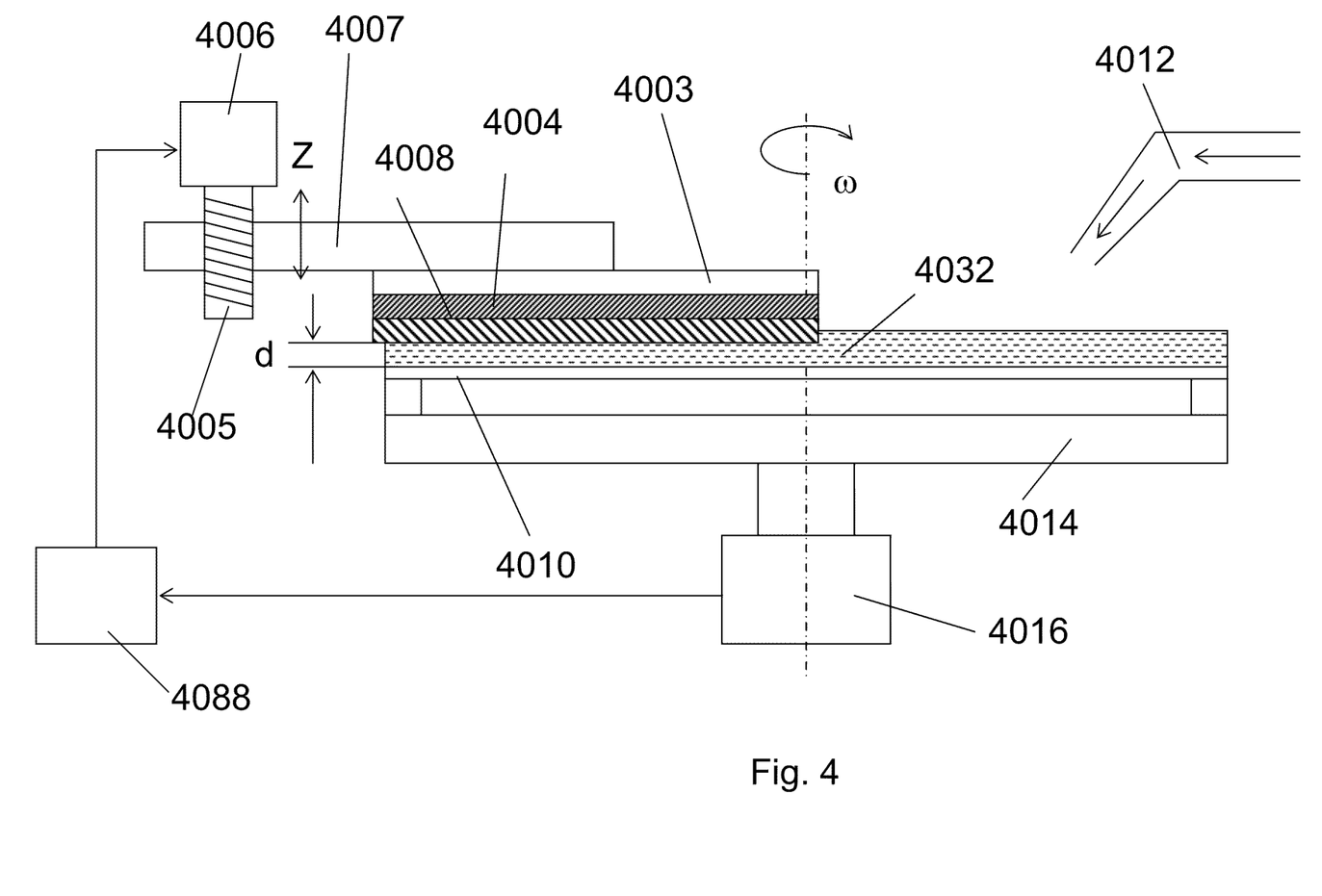
FIG. 4 depicts another exemplary wafer cleaning apparatus.

In order to overcome non uniform power distribution caused by variation of chuck gap during chuck rotation, the present invention discloses a method as shown in FIG. 4. The gap between mega sonic device 4003 and wafer 4010 is increased or reduced by lead screw 4005 and motor 4006 as chuck 4014 rotating during cleaning process. Control unit 4088 is used to control the speed of motor 4006 based on speed of motor 4016. For each rotation of wafer 4010 or chuck 4014, control unit 4088 instructs motor 4006 to move mega sonic device 4003 up or down:

$$\Delta z = 0.5\lambda/N \quad (2)$$

Where, $\lambda$ is wavelength of ultra/mega sonic wave, and N is an integer number between 2 to 1000.

Figure 5:
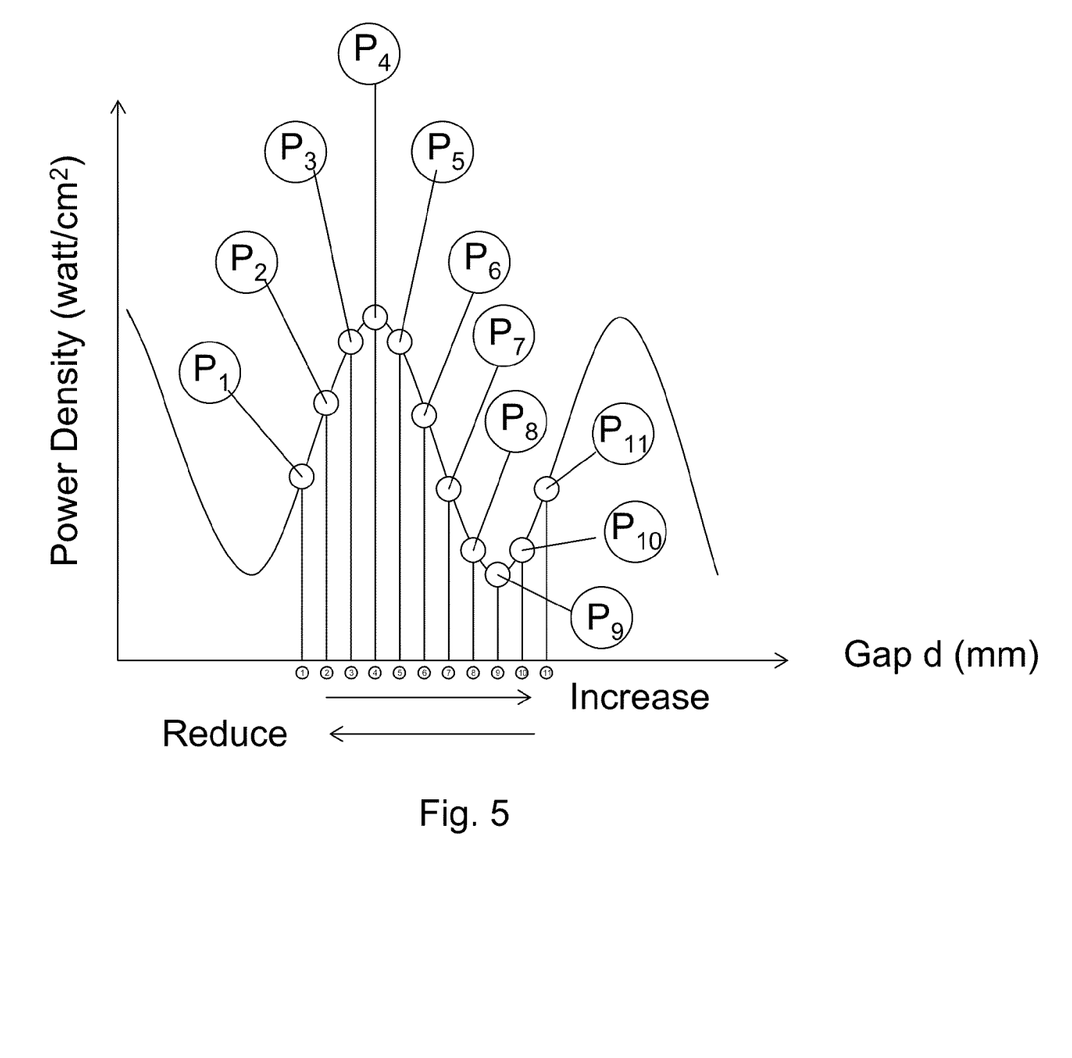
FIG. 5 depicts a cleaning method.

As shown further in detail in FIG. 5, when the gap increases for each rotation of wafer or chuck, the mega sonic power density at the same portion of wafer changes from P1 to P2. When the gap increases total half wavelength of mega sonic wave, the power density varies a full cycle from P1 to P11. The cycle starting point depends on the gap between mega sonic device and portion of wafer, however each portion on wafer will receive full cycle of power density when gap increases half wavelength of mega sonic wave. In other words, even gap between mega sonic device and wafer is not set uniformly due to reason described in FIG. 2, FIGS. 3A and 3B, each portion of the wafer will receive full cycle of mega sonic power when mega sonic device moves up half wavelength of mega sonic wave (about 0.8 mm for frequency of 937.5 kHz). This will guarantee each location of wafer to receive the same mount of mega sonic power density including the same average power density, the same maximum power density, and the same minimum power density. The operation sequence can be set as follows:

Process Sequence 1 (mega sonic frequency: f=937.5 kHz, and wavelength in deionized water=$\lambda$=1.6 mm):

Step 1: rotating wafer at speed of $\omega$, and $\omega$ is in the range of 10 rpm to 1500 rpm.

Step 2: move mega sonic device to adjacent to wafer with gap d, and d is in the range of 0.5 to 15 mm.

Step 3: turn on nozzle with deionized (DI) water or chemicals, and turn the mega sonic device on.

Step 4: for each rotation of chuck, move mega sonic device up 0.5$\lambda$/N (mm), where N is an integer number and in the range of 2 to 1000.

Step 5: continue step 4 until mega sonic device moves up total 0.5 n$\lambda$ (mm), where n is an integer number starting from 1.

Step 6: for each rotation of chuck, move mega sonic device down 0.5$\lambda$/N (mm), where N is an integer number and in the range of 2 to 1000.

Step 7: continue step 6 until mega sonic device moves down total 0.5 n$\lambda$ (mm), where n is an integer number starting from 1.

Step 8: repeat step 4 to step 7 until wafer is cleaned.

Step 9: turn off mega sonic devices, stop the DI water or chemicals, and then dry the wafer.

Process Sequence 2 (mega sonic frequency: f=937.5 kHz, and wavelength in deionized water=$\lambda$=1.6 mm):

Step 1: rotating wafer at speed of $\omega$, and $\omega$ is in the range of 10 rpm to 1500 rpm.

Step 2: move mega sonic device to adjacent to wafer with gap d, and d is in the range of 0.5 to 15 mm.

Step 3: turn on nozzle with deionized (DI) water or chemicals, and turn the mega sonic device on.

Step 4: for each rotation of chuck, move mega sonic device up 0.5$\lambda$/N (mm), where N is an integer number and in the range of 2 to 1000.

Step 5: continue step 4 until mega sonic device moves up total 0.5 n$\lambda$ (mm), where n is an integer number starting form 1.

Step 6: turn off mega sonic devices, stop the DI water or chemicals, and then dry the wafer.

The frequency of transducer can be set at ultra sonic range and mega sonic range, depending on the particle to be cleaned. The larger the particle size is, the lower frequency should be used. Ultra sonic range is between 20 kHz to 200 kHz, and mega sonic range is between 200 kHz to 10 MHz. Also frequency of mechanical wave can be alternated either one at a time in succession or concurrently in order to clean different size of particles on the same substrate or wafer. If a dual frequency of waves are used, the higher frequency $f_1$ should be multiple integer number of lower frequency $f_2$, and the transducer moving range should be the $0.5\lambda_2 n$, increment or reduction of gap for each rotation of chuck should be $0.5\lambda_1/N$, which $\lambda_2$ is wavelength of the wave with the lower frequency $f_2$, $\lambda_1$ is wavelength of the wave with the higher frequency $f_1$, and N is an integer number between 2 to 1000, and n is an integer number starting from 1.

Figure 6:
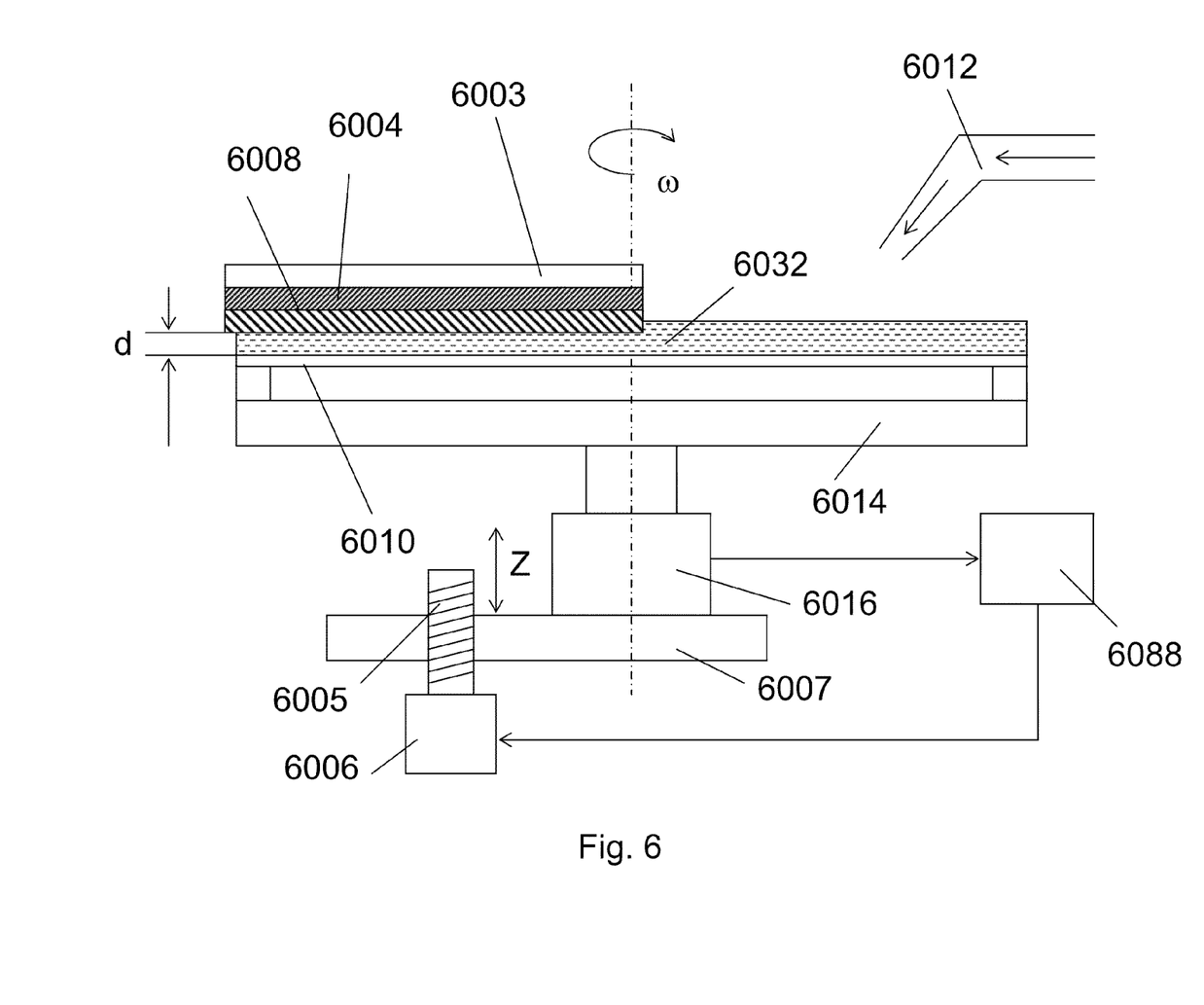
FIG. 6 depicts another exemplary wafer cleaning apparatus.

One example of chemicals being used to remove the particle and contamination are shown as follows:

Organic Material Removal: $H_2SO_4:H_2O_2=4:1$
Particle Reduction: $NH_4OH:H_2O_2:H_2O=1:1:5$
Metal Contamination Removal: $HCl:H_2O_2:H_2O=1:1:6$
Oxide Removal: Oxide Removal=$HF:H_2O=1:100$ FIG. 6 shows another embodiment of wafer cleaning apparatus using a mega sonic device according to the present invention. The embodiment is similar to that shown in FIG. 4, except that chuck 6014 is moved vertically by lead screw 6005 and motor 6006. Control unit 6088 changes the gap d between mega sonic device 6003 and wafer 6010 by moving chuck 6014 up and down through lead screw 6005 and motor 6006.

Figure 7:
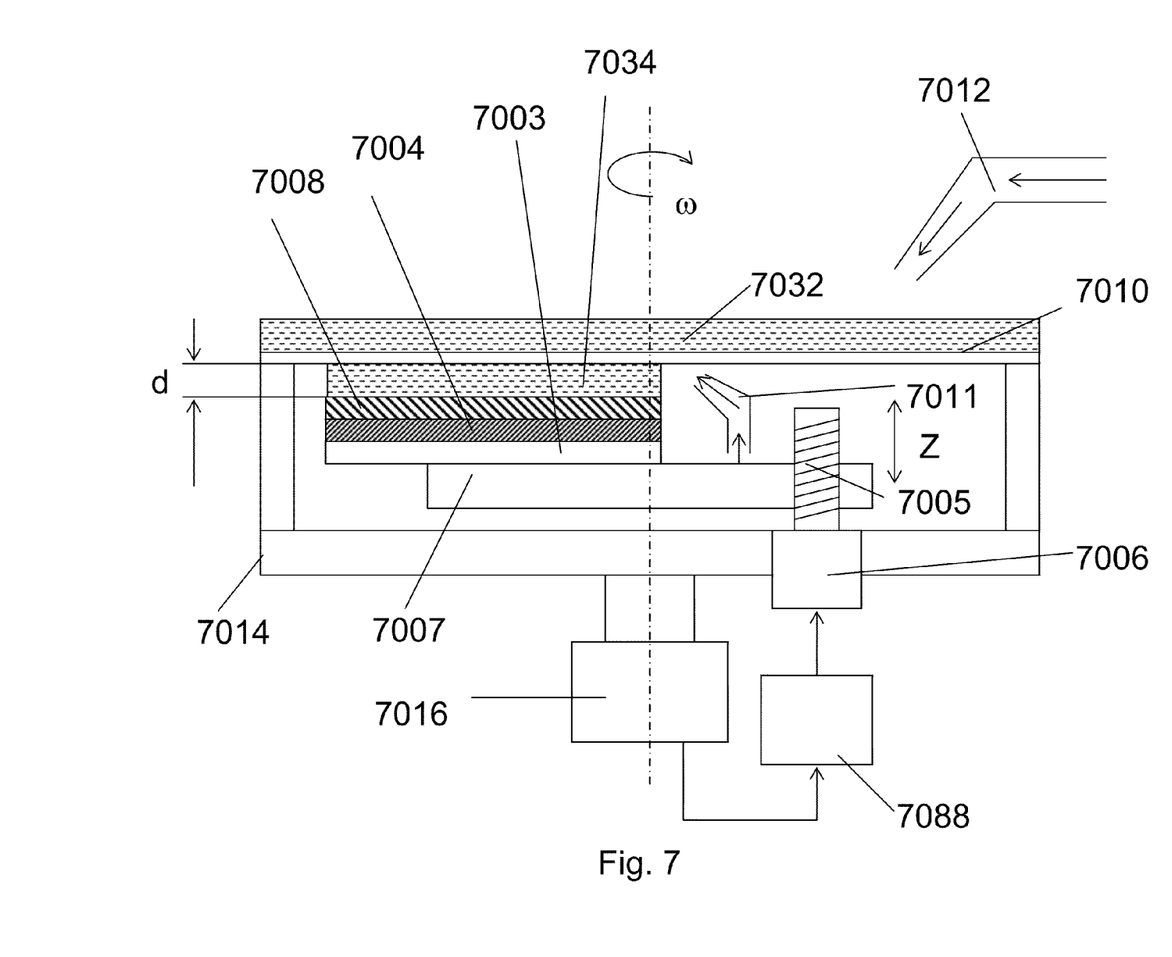
FIG. 7 depicts another exemplary wafer cleaning apparatus.

FIG. 7 shows another embodiment of wafer cleaning apparatus using a mega sonic device according to the present invention. The embodiment is similar to that shown in FIG. 4, except that mega sonic device 7003 is placed adjacently to the back side of wafer 7010, and is moved vertically by lead screw 7005 and motor 7006. Control unit 7088 changes the gap d between mega sonic device 7003 and back side of wafer 7010 by moving mega sonic device 7003 up and down through lead screw 7005 and motor 7006. Mega sonic wave is transmitted to front side of wafer 7010 and water film 7032 through water film 7034 and wafer 7010. Nozzle 7011 supplies DI water or chemicals to maintain water film 7034 between mega sonic device 7003 and back side of wafer 7010. The advantage of this embodiment is to reduce or eliminate possible damage caused by mega sonic wave to device structure on front side of wafer 7010.

Figure 8:
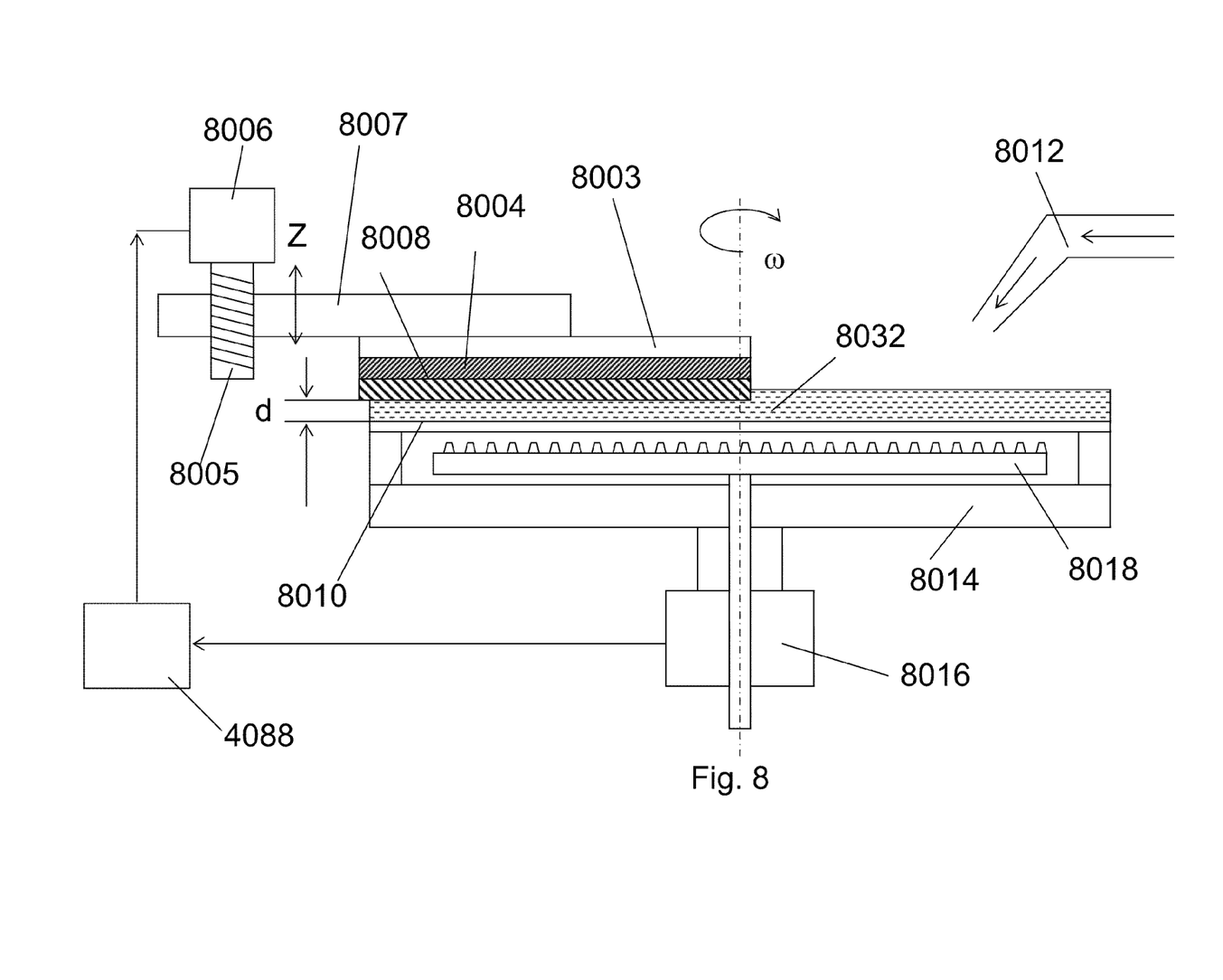
FIG. 8 depicts another exemplary wafer cleaning apparatus.

FIG. 8 shows another embodiment of wafer cleaning apparatus using a mega sonic device according to the present invention. The embodiment is similar to that shown in FIG. 4, except that wafer 8010 is placed face down, and a nozzle array 8018 is placed underneath of front side of wafer 8010. Mega sonic wave is transmitted to front side of wafer 8010 through water film 8032 and wafer 8010 itself. A nozzle array 8018 sprays liquid chemicals or DI water on to front side of wafer 8010.

Figure 9:
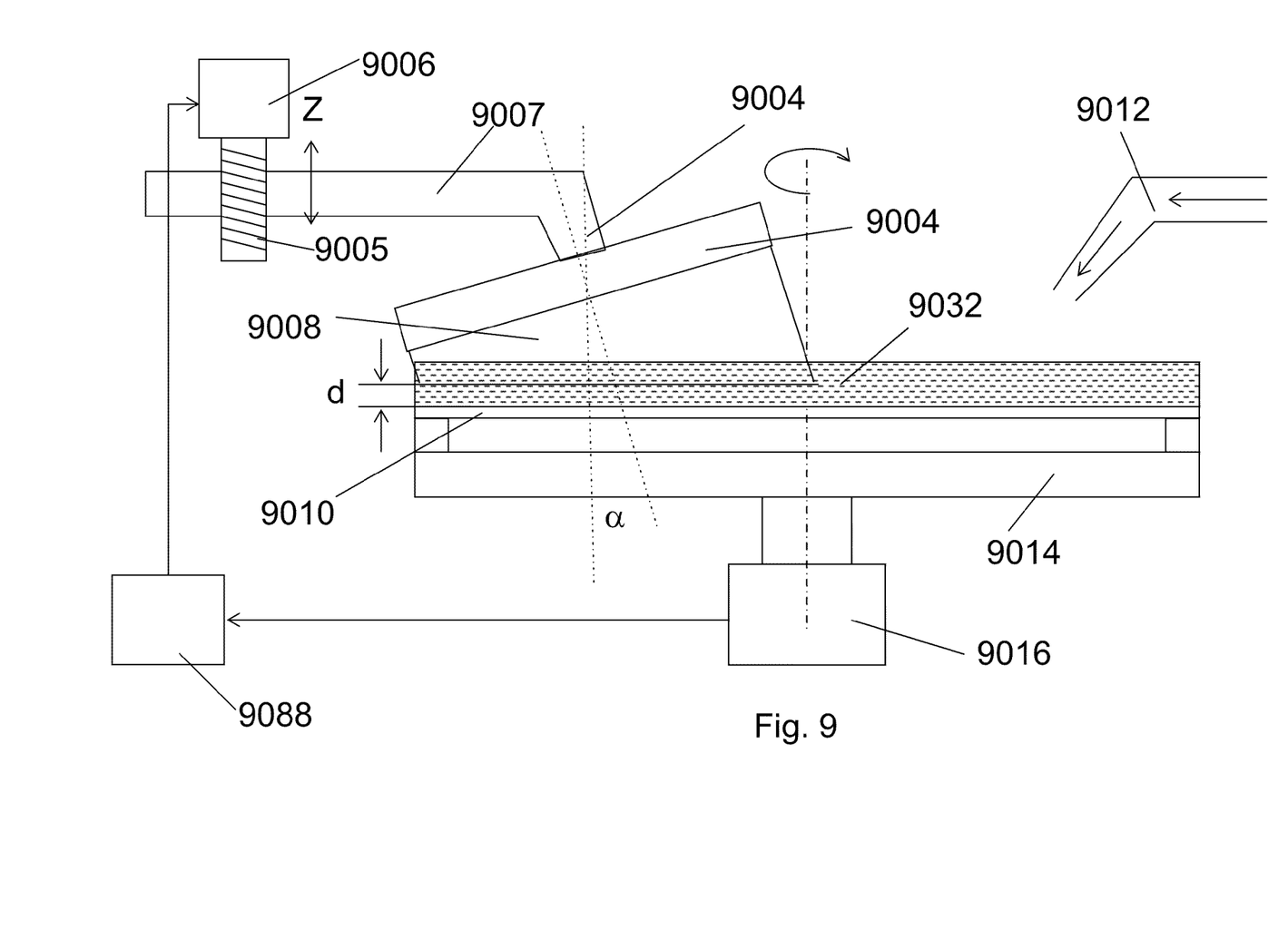
FIG. 9 depicts another exemplary wafer cleaning apparatus.

FIG. 9 shows another embodiment of wafer cleaning apparatus using a mega sonic device according to the present invention. The embodiment is similar to that shown in FIG. 4, except that surface of piezoelectric transducer 9004 has an angle $\alpha$ to surface of wafer 9010. Resonator 9008 is attached with piezoelectric transducer 9004, and mega sonic wave is transmitted to wafer through the resonator 9008 and DI water or chemical film 9032. Process sequence 1, 2, and 3 can be applied here.

Figure 10:
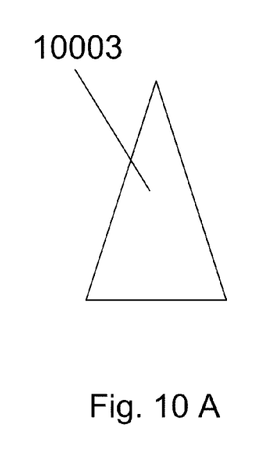
FIG. 10A-10G depicts variety of shape of ultra/mega sonic transducers.
Figure 10B:
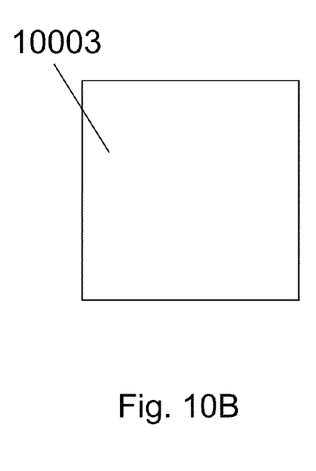
Figure 10D:
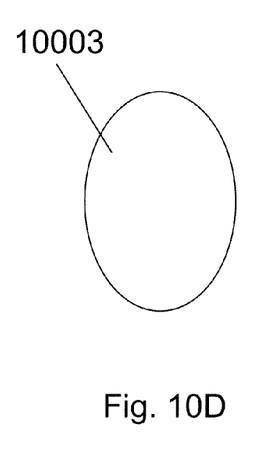
Figure 10E:
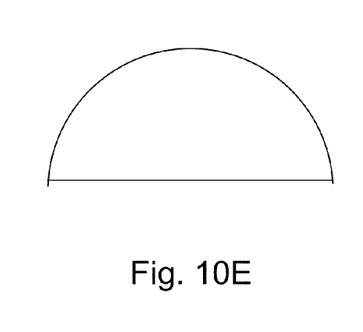
Figure 10F:
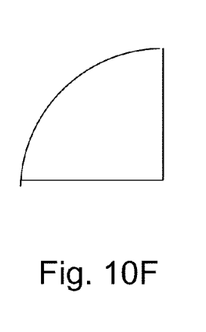
Figure 10G:
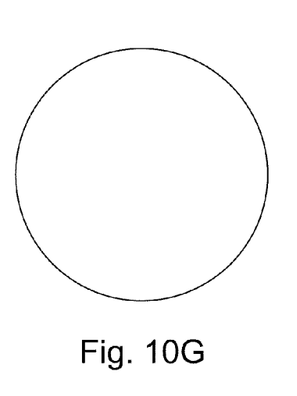

FIG. 10A to 10G show top view of mega sonic devices according to the present invention. Mega sonic device shown in FIG. 4 can be replaced by different shape of mega sonic devices 10003, i.e. triangle or pie shape as shown in FIG. 10A, rectangle as shown in FIG. 10B, octagon as shown in FIG. 10C, elliptical as shown in FIG. 10D, half circle as shown in FIG. 10E, quarter circle as shown in FIG. 10F, and circle as shown in FIG. 10G.

Although the present invention has been described with respect to certain embodiments, examples, and applications, it will be apparent to those skilled in the art that various modifications and changes may be made without departing from the invention.

What is claimed is:

1. An apparatus for cleaning a semiconductor substrate using an ultra/mega sonic device, comprising:
    a chuck holding a semiconductor substrate;
    a motor connected to the chuck;
    an ultra/mega sonic device being positioned adjacent to the semiconductor substrate;
    at least one nozzle injecting chemical liquid onto the semiconductor substrate and into a gap between the semiconductor substrate and the ultra/mega sonic device;
    a control unit configured to execute a cleaning process, the cleaning process including injecting the chemical liquid onto the semiconductor substrate and into the gap using the nozzle, applying an ultra/mega sonic wave to the chemical liquid, and changing the gap between the semiconductor substrate and the ultra/mega sonic device,
    wherein the control unit controls the speed of the chuck and continuously changes the gap between the semiconductor substrate and the ultra/mega sonic device based on the value of a wavelength of the ultra/mega sonic wave in the cleaning liquid and the rotation of the chuck,
    wherein during the cleaning process the control unit is configured to adjust the gap between the semiconductor substrate and the ultra/mega sonic device for each rotation of the chuck by $0.5\lambda/N$ until a total change of the gap is $0.5\ n\lambda$, wherein $\lambda$ is the wavelength of the ultra/mega sonic wave, N is an integer number between 2 to 1000, n is an integer number starting from 1, to provide a uniform power density application of the ultra/mega sonic device to the entire semiconductor substrate.

2. The apparatus of claim 1, wherein the gap is changed by moving the ultra/mega sonic device in a direction vertical to the semiconductor substrate.

3. The apparatus of claim 1, wherein the gap is changed by moving the chuck in a direction vertical to the ultra/mega sonic device.

4. The apparatus of claim 1, wherein the ultra/mega sonic device is positioned adjacent to a front side of the semiconductor substrate.

5. The apparatus of claim 1, wherein the ultra/mega sonic device is positioned adjacent to a back side of the semiconductor substrate.

6. The apparatus of claim 1, wherein the chemical liquid is injected to a front side of the semiconductor substrate by a first nozzle placed closer to the front side of the semiconductor wafer, and at the same time, the chemical liquid is injected to a back side of the semiconductor substrate by a second nozzle placed closer to the back side of the semiconductor substrate.

7. The apparatus of claim 1, wherein the control unit changes the gap by reduction of $0.5\lambda/N$ for each rotation of the chuck until the gap is decreased to a total of $0.5\ n\lambda$.

8. The apparatus of claim 1 wherein the ultra/mega sonic device generates dual frequencies waves.

9. The apparatus of claim 8 wherein the dual frequencies comprises a high frequency $f_1$ and a low frequency $f_2$, and $f_1=Mf_2$, wherein M is an integer number starting from 2.

10. The apparatus of claim 9, wherein the control unit changes the gap by increment of $0.5\lambda_1/N$ for each rotation of the chuck, wherein $\lambda_1$ is a wavelength of the wave with the high frequency $f_1$, N is an integer number between 2 to 1000.

11. The apparatus of claim 9, wherein the control unit changes the gap by reduction of $0.5\lambda_1/N$ for each rotation of the chuck, wherein $\lambda_1$ is a wavelength of the wave with the high frequency $f_1$, N is an integer number between 2 to 1000.

12. The apparatus of claim 9, wherein the control unit changes the gap in the range of $0.5\lambda_2 n$ during the cleaning process, wherein $\lambda_2$ is the wavelength of the wave with the low frequency $f_2$, and n is an integer number starting from 1.

* * * * *